United States Patent [19]

Lynk, Jr. et al.

[11] Patent Number: 5,384,547
[45] Date of Patent: Jan. 24, 1995

[54] APPARATUS AND METHOD FOR ATTENUATING A MULTICARRIER INPUT SIGNAL OF A LINEAR DEVICE

[75] Inventors: Charles N. Lynk, Jr., Bedford; Mark Van Horn, Arlington, both of Tex.

[73] Assignee: Motorola, Inc., Schaumburg, Ill.

[21] Appl. No.: 100,806

[22] Filed: Aug. 2, 1993

[51] Int. Cl.⁶ .............................................. H03G 3/20
[52] U.S. Cl. ................................... 330/136; 330/144; 330/284; 330/138
[58] Field of Search ............... 330/136, 138, 144, 145, 330/280, 284; 455/249.1

[56] References Cited

U.S. PATENT DOCUMENTS

| | | | |
|---|---|---|---|
| 4,313,215 | 1/1982 | Jansen | 455/249.1 X |
| 4,509,206 | 4/1985 | Carpe et al. | 455/249.1 X |
| 4,803,440 | 2/1989 | Hotta et al. | 330/284 X |
| 5,119,040 | 6/1992 | Long et al. | 330/149 |

FOREIGN PATENT DOCUMENTS 4341027 11/1992 Japan ................... 330/138

*Primary Examiner*—James B. Mullins
*Attorney, Agent, or Firm*—Raymond J. Warren

[57] ABSTRACT

The apparatus first measures the peak power of a multichannel signal, or representation thereof. The peak power is compared with one or more peak power threshold values. If the measured peak power exceeds a threshold value, the multichannel signal is attenuated prior to being processed by the linear power amplifier.

2 Claims, 5 Drawing Sheets

FIG. 8 is a graph showing the probability of use of a certain number of channels within the transmitter.

APPARATUS AND METHOD FOR ATTENUATING A MULTICARRIER INPUT SIGNAL OF A LINEAR DEVICE

FIELD OF THE INVENTION

The present invention relates, in general, to linear devices and, more particularly, to an apparatus and method for attenuating a multicarrier input signal of a linear device.

BACKGROUND OF THE INVENTION

In linear devices, particularly linear power amplifiers (LPAs), there exists a problem with InterModulation (IM) signals generated from the processing of multicarrier signals. When the instantaneous peak envelope of a multicarrier signal exceeds the power rating of the LPA, excessive IM is generated. This spurious IM signal is output from the LPA into the environment. In a cellular communication environment, this means that the IM signal could adversely impact the call of a user currently operating at the same frequency as the IM signal.

One current solution to this problem is to cut back the power of each carrier in the multicarrier signal such that the IM signal generated has a signal strength below a certain maximum value (e.g. 60 dBc). However this solution penalizes the users by weakening their signals and effectively reducing the size of the cell in a cellular system.

SUMMARY OF THE INVENTION

A preferred embodiment of an apparatus for attenuating a multicarrier input signal of a linear device, such as a linear power amplifier, is described herein. The apparatus comprises a means for measuring a peak power of the multicarrier signal, or a representation of that signal, prior to being inputted to the linear device. A comparator is then used to compare the peak power with a selected threshold value. If the peak power exceeds the preset threshold, an attenuating means will attenuate the signal before being inputted to the linear device.

In operation, the present device first measures the peak power of the multicarrier input signal, or a representation thereof. The peak power is then compared to the threshold. If the peak power exceeds the threshold, the signal is attenuated.

It is also possible to provide multiple thresholds. As each threshold is exceeded, a different attenuation factor is applied to the signal.

DETAILED DESCRIPTION OF THE DRAWINGS

Figure 1:
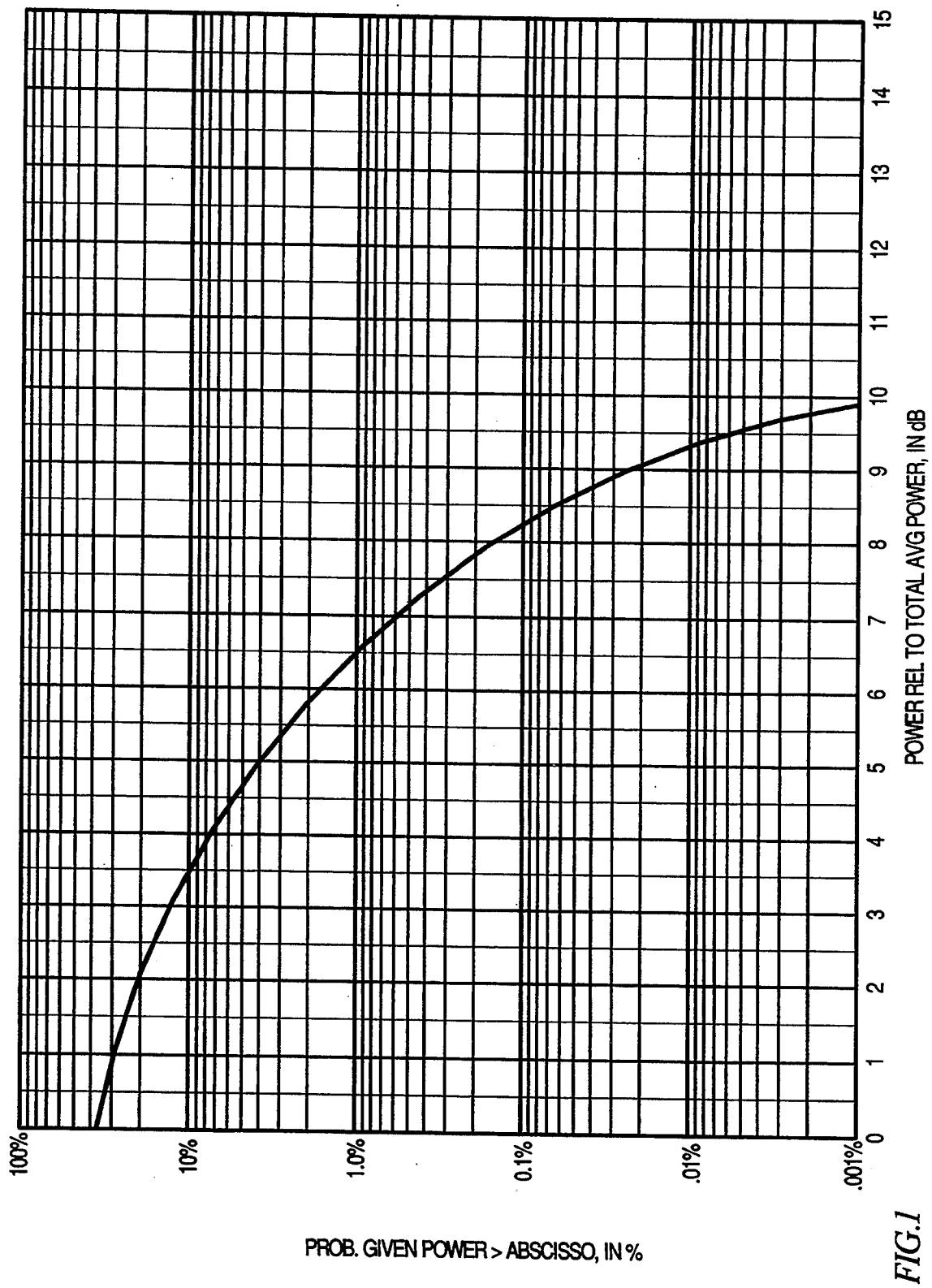
FIG. 1 is a graph illustrating the probability of 20-carrier signal peaking to a given instantaneous power level.

A linear power amplifier (LPA) is a device utilized to uniformly amplify a plurality of signals residing on a plurality of channels, or a multichannel signal. However, as these signals are processed through the LPA, an undesired InterModulation (IM) signal is generated. This IM signal causes interference to signals both in and out of the immediate band. In FIG. 1, a graph showing the probability of peaking to a given instantaneous power level when 20 carriers are present is illustrated. As shown, a system with 10 dB of "headroom" would be sufficient to compensate for the peak power all but 0.001% of the time.

Figure 2:
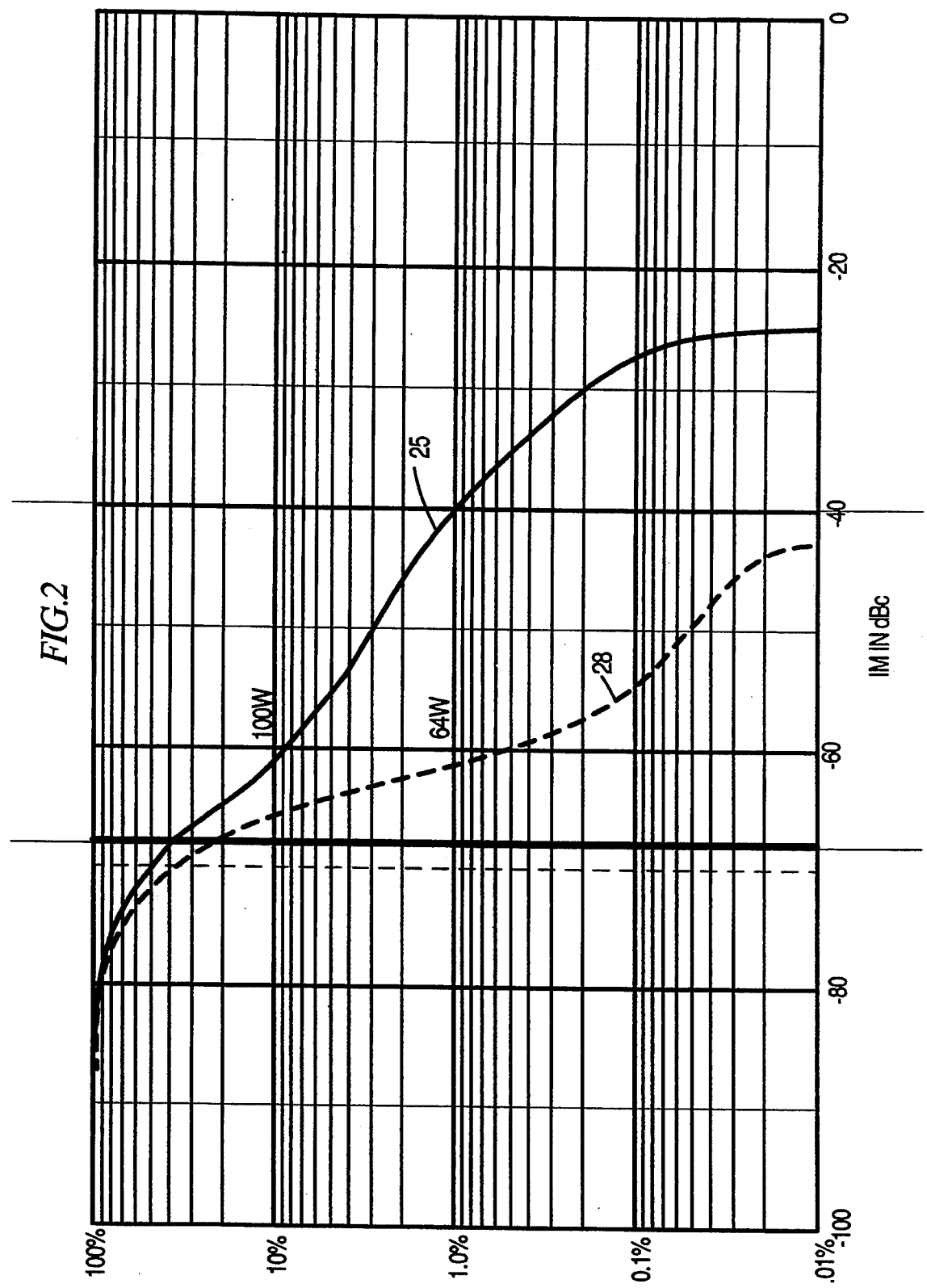
FIG. 2 is a graph illustrating the measure of spurious IM data.

However, in application, it has been found that IM generated less than 0.1% of the time is acceptable. As shown in FIG. 2, a chart of measured IM is graphed for 100 watts, line 25, and 64 watts, line 28, of average power of a multichannel signal. In this environment, a probability of less than 0.1% would not have enough of an effect on the impacted signal to raise concern. Whereas a probability above 0.1% would progressively have an impact that would be noticeable by the user effected. At 100 watts, line 25 crosses the 0.1% level at around −27 dBc.

As discussed above, one solution to this problem is to reduce the overall peak power by reducing the average power of each signal being processed. If the average power of the envelope is reduced to 64 Watts, the 0.1% probability level is crossed around the −56 dBc level. This provides an improvement of around −26 dBc.

The disadvantage of this solution is that the system is always set to 64 Watts average power. This means that even if only 2 signals are being transmitted, as opposed to the 20 signals assumed above, their power is still limited and the system is not permitted to operate at its maximum power per channel. This results in reduced service to all of the users and an effectively reduced cell size.

The present invention provides the benefits reduced power has when the system is loaded while not penalizing the system when not loaded. Referring initially to the block diagram of FIG. 3, an attenuating apparatus, generally designated 30, is illustrated. A multichannel signal destined for an LPA 39 is provided to a node 31. This multichannel signal is passed through a coupler 32 where the signal is monitored and a representation of the signal is generated. The representative signal is forwarded to a peak detector 33. Alternatively, coupler 32 could be implemented with a transformer or power splitter.

Figure 4:
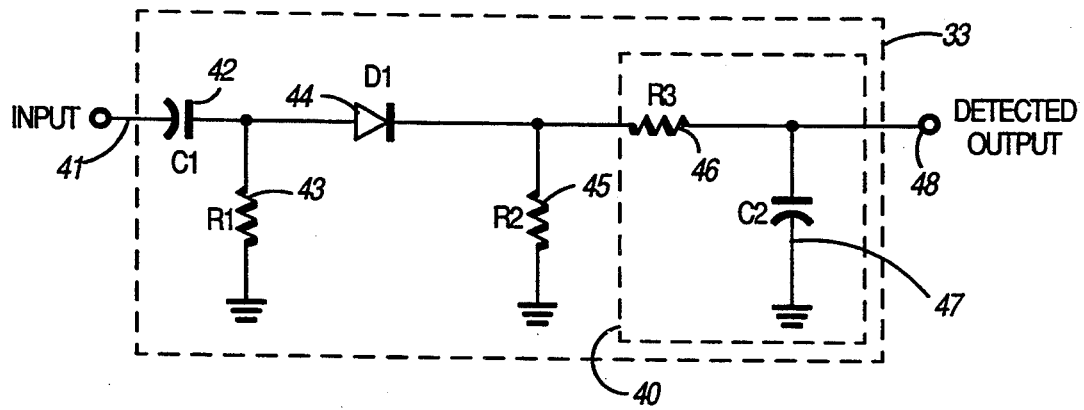
FIG. 4 is an expanded block diagram of a peak detector utilized in the block diagram of FIG. 3.

Peak detector 33 is a means to measure the peak power of the multichannel envelope. An example of a peak detector 33 is illustrated in FIG. 4. The output from coupler 32 is input at node 41 and provided to capacitor 42 (C1) which is used as a radio frequency (RF) bypass filter. The output of capacitor 42 is coupled to the input of a hot carrier diode 44 (D1) and to a resistor 43 (R1) which is coupled to ground. The output of diode 44 is coupled to a resistor 45 and an RC network 40 consisting of resistor 46 and a capacitor 47. Resistor 45 is provided to set the decay time of detector 33 and RC network 40 provides filtering of the signal. A signal having a voltage representing the peak voltage of the multichannel signal is output through a node 48.

The output of peak detector 33 is transmitted to one or more comparators 34. In the present embodiment, each comparator is set to compare the output of detector 33 to a preset threshold level. It should be noted, however, that it would be possible to replace the plurality of comparators with a single comparator having an adjustable threshold level.

Figure 5:
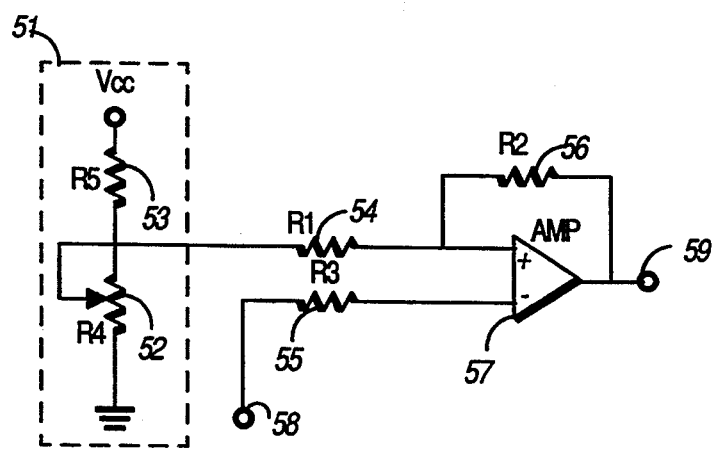
FIG. 5 is another expanded block diagram of a comparator utilized in the block diagram of FIG. 3.

An example of comparator 34 is illustrated in FIG. 5. Comparator 34 has a network 51 which serves to set the threshold power value for the comparison. Network 51 consists of a pair of resistors 52 (R4) and 53 (R5) being coupled between a reference voltage, Vcc, and ground. An output reference is then tapped into resistor 52 and provided to a resistor 54 (R1). The output of resistor 54 is coupled to the positive input of an amplifier 57 which is biased by a resistor 56 (R2) coupled between the output and the positive input of amplifier 57.

The output from peak detector 33 is provided to comparator 34 at a node 58 and to the negative input of amplifier 57 through a resistor 55 (R3). The output of comparator 34 is provided at node 59.

Figure 3:
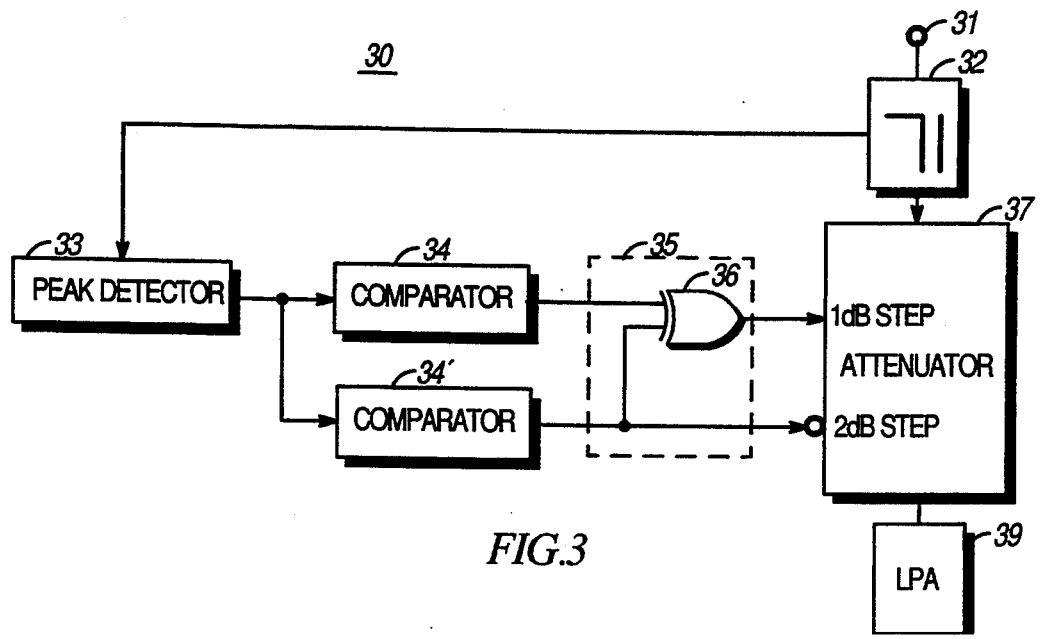
FIG. 3 is block diagram of an apparatus for attenuating a multicarrier signal.

Because comparators 34 are discrete detectors in the present example, some logic circuitry 35 is required to process the appropriate signal. In FIG. 3, logic circuitry 35 consists of an exclusive-OR (XOR) gate 36 which has its output inverted (XOR). The output from logic 35 is then used by an attenuator 37 to select the amount of attenuation. The current design was set such that the threshold of comparator 34 is less than that of comparator 34'.

In operation, if the peak power is less than the threshold of comparator 34, no attenuation is performed on the multicarrier signal. If the peak power exceeds the threshold of comparator 34, 1 dB of attenuation is provided. If the peak power exceeds the threshold of comparator 34', then 2 dB of attenuation is selected.

Figure 6:
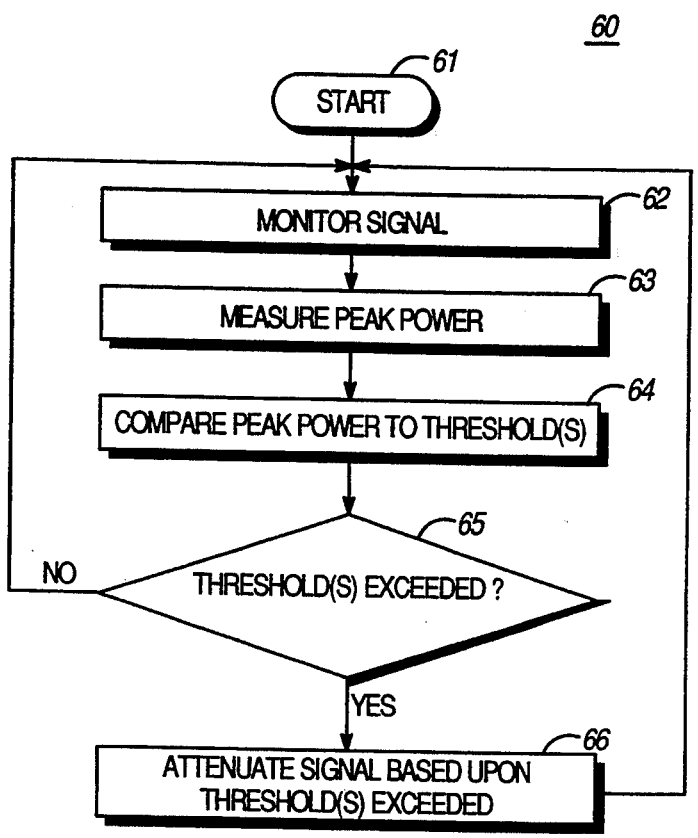
FIG. 6 is a flow chart of a process embodying the present invention.

One example of the operation of the present invention is demonstrated by the process, generally designated 60, represented by the flow chart of FIG. 6. Process 60 commences at step 61 and monitors the incoming multicarrier signal, step 62. A peak power measurement is then taken of the monitored multicarrier signal at step 63. The measured peak power is compared to a threshold, or multiple thresholds, step 64, to determine if the peak power exceeds one or more of the thresholds, decision step 65. If a threshold is not exceeded, then process 60 loops back to step 62 and repeats. If a threshold is exceeded, then the multicarrier signal is attenuated based upon the threshold exceeded (e.g. 1 or 2 dB as set forth in FIG. 3.

Figure 7:
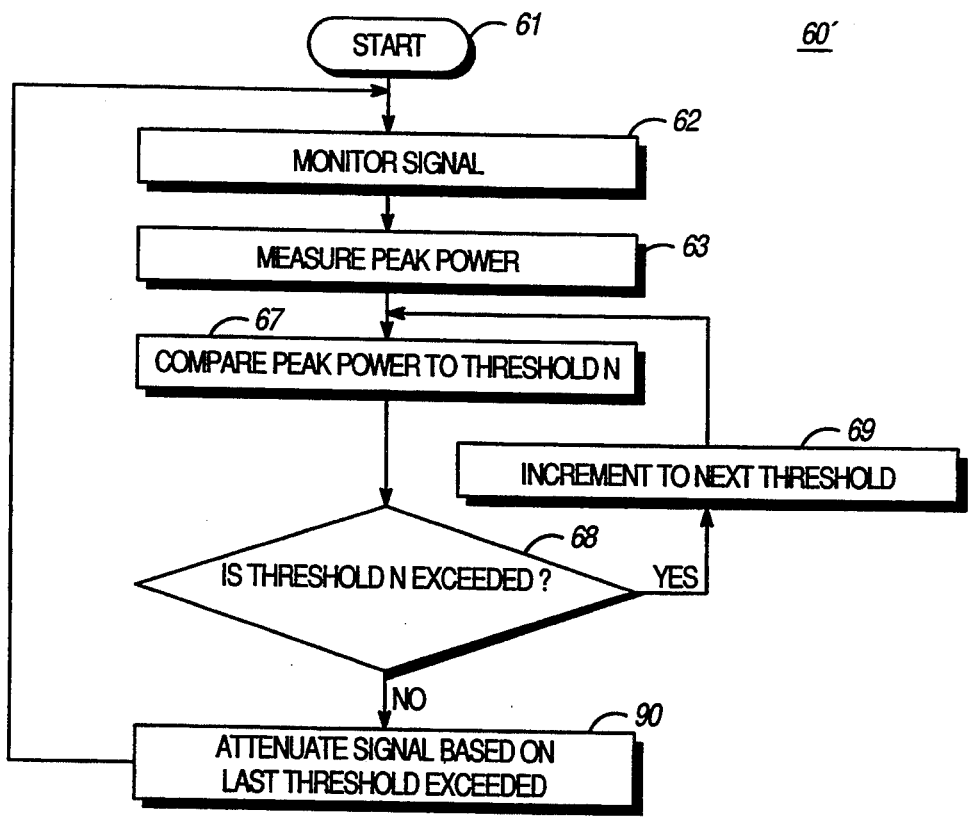
FIG. 7 is a flow chart of an alternative process embodying the present invention.

An alternative embodiment of the present invention is demonstrated by the process, generally designated 60', of FIG. 7 Here, the signal is monitored, step 62, and the peak power measured, step 63, as in process 60. The measured peak power is then compared to threshold N, step 67. The first time through, threshold N is threshold 1. If the peak power exceeds threshold 1, decision step 68, then threshold N is incremented, step 69. In this example, the threshold would be incremented to threshold 2. Comparing step 67 and decision step 68 are then repeated. This continues until a threshold N is reached that is not exceeded by the peak power. The signal is then attenuated based upon the last threshold exceeded, step 90. Once the attenuation is determined, process 60' loops back to step 62 and repeats.

Figure 8:
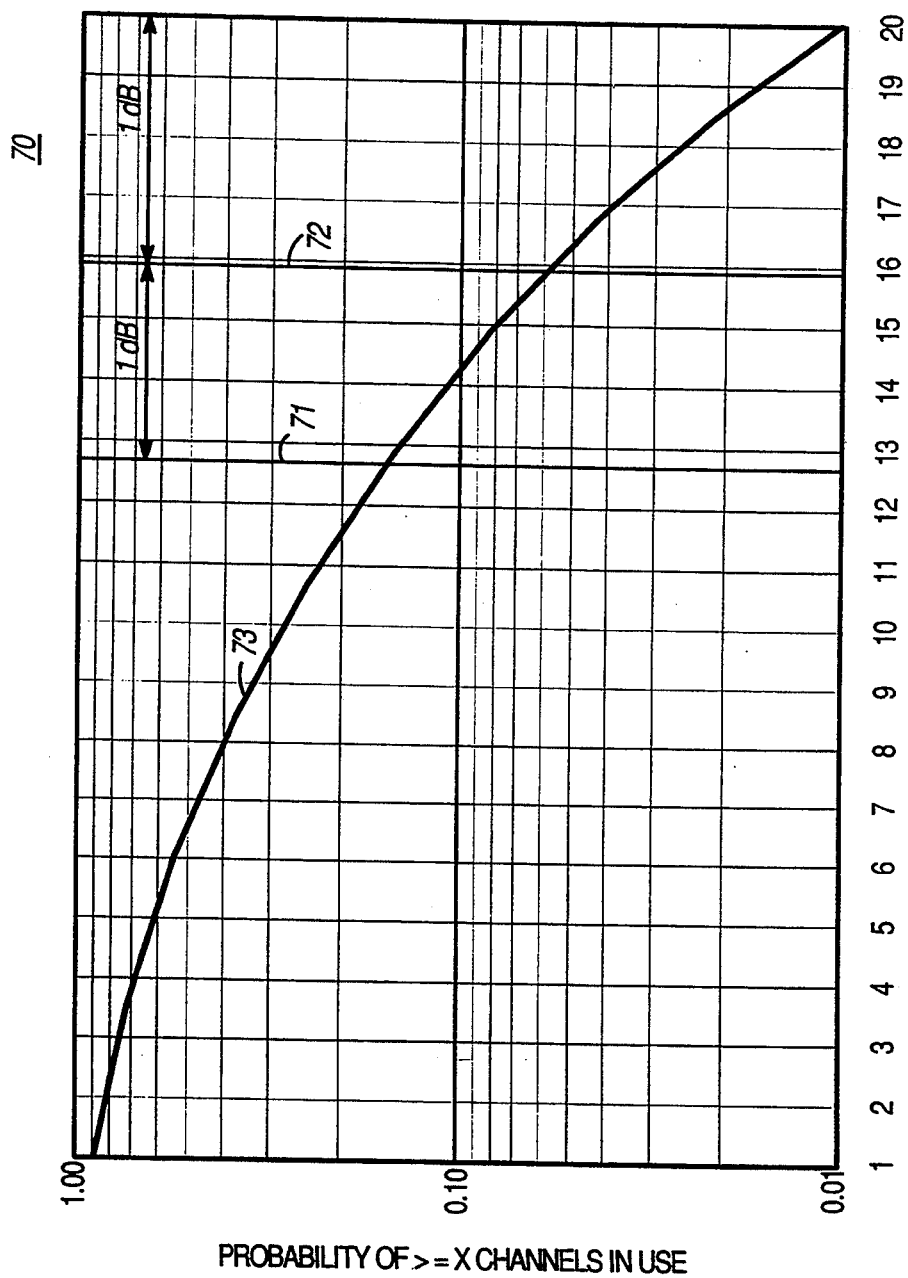

In the present embodiment the threshold levels were established to provide the results represented in graph 70 of FIG. 8. Here a first threshold 71 is set such that when the peak power typical for 13 or more users is detected, the multicarrier signal is attenuated by 1 dB. A second threshold 72 is established such that when peak power typical for 16 or more signals is detected, a second dB is added to the attenuation of the multicarrier signal.

Line 73 illustrates the probability of such loading capacities. The probability of having 13 or more users on the system is around 17.2%. This means that the multicarrier signal will be attenuated at least 1 dB approximately 17.2% of the time. In addition, the second dB of attenuation—equivalent to the 64 Watt setting in the prior art—is only used 6.4% of the time.

This is a significant improvement over the prior art of leaving the signal attenuated 2 dB all of the time. Stating this another way, there is no impact on the users to compensate for potential peak activity 82.8% of the time, as opposed to being impacted 100% of the time under the prior art solutions.

Finally, the attenuated signal is output from attenuator 37 and provided to LPA 39 for transmission.

Thus, it will be apparent to one skilled in the art that there has been provided in accordance with the invention, an apparatus and method for attenuating a multicarrier input signal of a linear device which fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method for attenuating a multicarrier input signal of a linear device, said method comprising the steps of:

measuring a peak power of said multicarrier input signal;

comparing said peak power to a plurality of thresholds; and attenuating said input signal by an amount relating to a number of said plurality of thresholds exceeded if said peak power exceeds one or more of said plurality of thresholds.

2. A method for attenuating a multicarrier input signal of a linear power amplifier comprising the steps of:

monitoring said multicarrier signal to produce a representative multicarrier signal;

measuring a peak power of said representative multicarrier signal;

comparing said peak power to a first preset threshold;

attenuating said input signal by a first amount if said peak power exceeds said first preset threshold;

comparing said peak power to a second preset threshold; and attenuating said input signal by a second amount if said peak power exceeds said first preset threshold.

* * * * *